(12) United States Patent
Kido et al.

(10) Patent No.: US 12,407,328 B2
(45) Date of Patent: Sep. 2, 2025

(54) HYBRID FILTER, MULTIPLEXER, RADIO-FREQUENCY MODULE, AND COMMUNICATION DEVICE

(71) Applicant: Murata Manufacturing Co., Ltd., Kyoto (JP)

(72) Inventors: Syunsuke Kido, Kyoto (JP); Naru Morito, Kyoto (JP); Takanori Uejima, Kyoto (JP); Masanari Miura, Kyoto (JP); Yukiya Yamaguchi, Kyoto (JP); Takuma Kuroyanagi, Kyoto (JP); Tomomi Yasuda, Kyoto (JP); Masanori Kato, Kyoto (JP); Yuuki Fukuda, Kyoto (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 255 days.

(21) Appl. No.: 18/329,607

(22) Filed: Jun. 6, 2023

(65) Prior Publication Data
US 2023/0318573 A1   Oct. 5, 2023

Related U.S. Application Data

(63) Continuation of application No. PCT/JP2021/029237, filed on Aug. 5, 2021.

(30) Foreign Application Priority Data

Dec. 11, 2020 (JP) .................................. 2020-206045
Mar. 31, 2021 (JP) .................................. 2021-059093

(51) Int. Cl.
H03H 9/64 (2006.01)

(52) U.S. Cl.
CPC ................. H03H 9/6406 (2013.01)

(58) Field of Classification Search
CPC .. H03H 9/6406; H03H 9/0542; H03H 9/0552; H03H 9/605; H03H 9/6483;
(Continued)

(56) References Cited

U.S. PATENT DOCUMENTS

| | | | |
|---|---|---|---|
| 2007/0090521 A1* | 4/2007 | Imaizumi | H01L 23/49558 257/E23.128 |
| 2010/0219915 A1* | 9/2010 | Yoshikawa | H01P 1/20345 333/204 |

(Continued)

FOREIGN PATENT DOCUMENTS

| | | |
|---|---|---|
| JP | 2020-014204 A | 1/2020 |
| WO | 2019/065027 A1 | 4/2019 |
| WO | 2019/240095 A1 | 12/2019 |

OTHER PUBLICATIONS

International Search Report and Written Opinion mailed on Oct. 26, 2021, received for PCT Application PCT/JP2021/029237, filed on Aug. 5, 2021, 9 pages including English Translation.

*Primary Examiner* — John W Poos
(74) *Attorney, Agent, or Firm* — XSENSUS LLP

(57) ABSTRACT

A hybrid filter includes a module substrate having a major surface and a major surface that are opposite to each other, acoustic wave resonator elements disposed at the module substrate, inductors disposed at the module substrate, and a capacitor disposed at the module substrate. The pass band of the hybrid filter is wider than the resonance band width of the acoustic wave resonator elements. One of the acoustic wave resonator elements, the inductors, and the capacitor is a first circuit element, and the first circuit element is disposed at the major surface. Another of the acoustic wave resonator elements, the inductors, and the capacitor is a second circuit element, and the second circuit element is disposed at the major surface.

19 Claims, 9 Drawing Sheets

(58) Field of Classification Search
CPC ........ H03H 9/542; H03H 7/1766; H04B 1/00; H04B 1/38
See application file for complete search history.

(56) References Cited

U.S. PATENT DOCUMENTS

2020/0252044 A1\* 8/2020 Sekine .................... H05K 3/341
2020/0252053 A1\* 8/2020 Taguchi ............... H03H 9/0566

\* cited by examiner (a)

(b)

HYBRID FILTER, MULTIPLEXER, RADIO-FREQUENCY MODULE, AND COMMUNICATION DEVICE

CROSS REFERENCE TO RELATED APPLICATIONS

The present application is a bypass continuation of PCT filing PCT/JP2021/029237, filed on Aug. 5, 2021, which claims priority to Japanese Patent Application 2020-206045, filed on Dec. 11, 2020, and Japanese Patent Application 2021-059093, filed on Mar. 31, 2021, the entire contents of all of which are incorporated herein by reference.

TECHNICAL FIELD

The present disclosure relates to a hybrid filter, a multiplexer, a radio-frequency module, and a communication device.

BACKGROUND ART

Patent Document 1 discloses a hybrid acoustic LC filter including an acoustic resonator (an acoustic wave resonator), an inductor, and a capacitor. According to Patent Document 1, this hybrid acoustic LC filter provides a relatively wide pass band and at the same time achieves a strict out-of-band rejection specification.

CITATION LIST

Patent Document

Patent Document 1: Japanese Unexamined Patent Application Publication No. 2020-14204

SUMMARY OF DISCLOSURE

Technical Problem

However, because the hybrid acoustic LC filter disclosed in Patent Document 1 is formed by an acoustic wave resonator-inductor-capacitor combination, the hybrid acoustic LC filter includes many components. As a result, a problem arises in which the hybrid acoustic LC filter is relatively large in size. If the mounting density is increased for the purpose of reducing the size, another problem arises in which unnecessary coupling between components occurs, and the bandpass characteristic of the filter deteriorates.

The present disclosure has been made to address the problems described above, and an object thereof is to provide a small hybrid filter including an acoustic wave resonator, an inductor, and a capacitor in which degradation of filter characteristics is suppressed and further provide a multiplexer, a radio-frequency module, and a communication device.

Solution to Problem

A hybrid filter according to an aspect of the present disclosure includes a substrate having a first major surface and a second major surface that are opposite to each other, one or more acoustic wave resonator elements disposed at the substrate, one or more first inductors disposed at the substrate, and one or more first capacitors disposed at the substrate. The pass band width of the hybrid filter is wider than the resonance band width of the one or more acoustic wave resonator elements. One of the one or more acoustic wave resonator elements, the one or more first inductors, and the one or more first capacitors is a first circuit element, and the first circuit element is disposed at the first major surface. Another of the one or more acoustic wave resonator elements, the one or more first inductors, and the one or more first capacitors is a second circuit element, and the second circuit element is disposed at the second major surface.

Advantageous Effects

The present disclosure provides a small hybrid filter including an acoustic wave resonator element, an inductor, and a capacitor in which degradation of filter characteristics is suppressed and further provide a multiplexer, a radio-frequency module, and a communication device.

DESCRIPTION OF EMBODIMENTS

Figure 1:
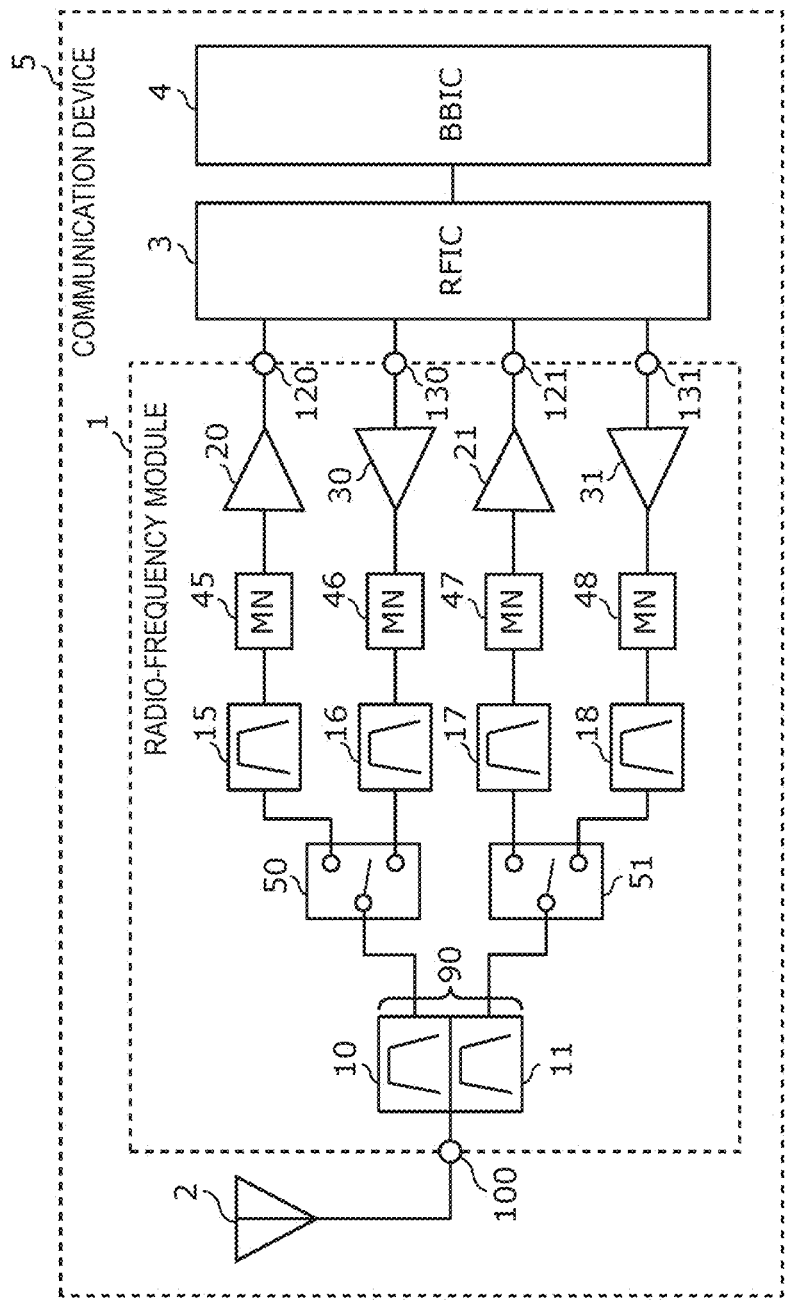
FIG. 1 is a circuit configuration diagram of a radio-frequency module and a communication device according to an embodiment.

Hereinafter, an embodiment of the present disclosure will be described in detail. It should be noted that the embodiment described below is a comprehensive or specific instance. Specifics including numerical values, shapes, materials, constituent elements, arrangements of the constituent elements, and modes of connection given in the following embodiment are mere instances and are not intended to limit the present disclosure. Among the constituent elements in the following examples and modifications, constituent elements not recited in any of the independent claims are described as arbitrary constituent elements. The sizes or size ratios of the constituent elements illustrated in the drawings are not necessarily exact. Like reference symbols are used to denote substantially like configurations in the drawings, and redundant descriptions thereof may be omitted or simplified.

In the following description, words used to express relationships between elements, such as parallel and vertical, words used to express the shape of an element, such as rectangular, and numerical ranges do not necessarily denote the exact meanings but denote substantially the same meanings involving, for example, several percent differences.

As used herein, the expression "A is disposed at a first major surface of a substrate" means not only that A is mounted directly on the first major surface but also that of the space on the first major surface side and the space on the second major surface side that are separated by the substrate, A is disposed in the space on the first major surface side. Specifically, the expression also means that A is mounted at the first major surface with another circuit element, an electrode, or another element that is interposed therebetween.

In the following description, the term "couple" includes not only the case in which a circuit component is coupled directly to another circuit component by using a connection terminal and/or an interconnection conductor but also the case in which a circuit component is electrically coupled to another circuit component via still another circuit component. The expression "coupled between A and B" means that a circuit element is coupling to both A and B while the circuit element is positioned between A and B.

In the drawings described below, the x axis and the y axis are axes perpendicular to each other in a plane parallel to major surfaces of a module substrate. The z axis is an axis perpendicular to major surfaces of a module substrate; the forward direction of the z axis indicates an upward direction, and the reverse direction of the z axis indicates a downward direction.

Regarding the module configuration of the present disclosure, the expression "plan view" denotes that an object orthogonally projected on an xy plane is viewed from the front side in the positive direction of the z axis. The expression "a component is disposed at a major surface of a substrate" includes the case in which the component is positioned in contact with the major surface of the substrate, the case in which the component is positioned over the major surface without contact with the major surface, and the case in which the component is partially embedded in the substrate at the major surface.

In the following description, in the case in which A, B and C is mounted on the substrate, the expression "when the substrate (or the major surface of the substrate) is viewed in plan view, C is disposed between A and B" means that the region occupied by C is intersected by at least one of the line segments connecting points within A and points within B when the substrate is viewed in plan view. The plan view of a substrate denotes that the substrate and circuit elements mounted on the substrate are viewed in the state in which the substrate and circuit elements are orthogonally projected on a plane parallel to the major surface of the substrate.

In the following, a "transmit path" refers to a transfer line formed by, for example, an interconnection for transferring radio-frequency transmit signals, an electrode directly coupled to the interconnection, and a terminal directly coupled to the interconnection or electrode. Similarly, a "receive path" refers to a transfer line formed by, for example, an interconnection for transferring radio-frequency receive signals, an electrode directly coupled to the interconnection, and a terminal directly coupled to the interconnection or electrode.

Embodiment

[1. Configuration of Radio-Frequency Module 1 and Communication Device 5 According to Embodiment]

FIG. 1 is a circuit configuration diagram of a radio-frequency module 1 and a communication device 5 according to the embodiment. As illustrated in this drawing, the communication device 5 includes the radio-frequency module 1, an antenna 2, a radio-frequency (RF) signal processing circuit (RFIC) 3, and a baseband signal processing circuit (BBIC) 4.

The RFIC 3 is a radio frequency signal processing circuit configured to process a radio-frequency signal received or to be transmitted by the antenna 2. Specifically, the RFIC 3 processes a receive signal inputted through a receive path of the radio-frequency module 1 by for example, downconversion and outputs the receive signal generated by the signal processing to the BBIC 4. The RFIC 3 outputs a radio-frequency transmit signal processed based on a signal inputted from the BBIC 4 to a transmit path of the radio-frequency module 1.

The BBIC 4 performs data processing using signals of frequencies lower than radio-frequency signals transferred in the radio-frequency module 1. The signal processed by the BBIC 4 is used as, for example, an image signal for displaying an image or a sound signal for talk through a speaker.

The RFIC 3 functions as a controller for controlling connections of switches 50 and 51 included in the radio-frequency module 1 based on whether the radio-frequency module 1 is used for transmission or reception and which communication band (frequency range) is used. Specifically, the RFIC 3 controls connections of the switches 50 and 51 included in the radio-frequency module 1 by using a control signal (not illustrated in the drawing). The controller may be external to the RFIC 3; for example, the controller may be provided in the radio-frequency module 1 or the BBIC 4.

The RFIC 3 also functions as a controller for controlling the gain of power amplifiers 30 and 31 included in the radio-frequency module 1 and a supply voltage Vcc and a bias voltage Vbias that are to be supplied to the power amplifiers 30 and 31.

The antenna 2 is coupled to an antenna connection terminal 100 of the radio-frequency module 1. The antenna 2 emits a radio-frequency signal outputted from the radio-frequency module 1. The antenna 2 also receives a radio-frequency signal from outside and outputs the radio-frequency signal to the radio-frequency module 1.

In the communication device 5 according to the present embodiment, the antenna 2 and the BBIC 4 are non-essential constituent elements.

The following describes a detailed configuration of the radio-frequency module 1.

As illustrated in FIG. 1, the radio-frequency module 1 includes the antenna connection terminal 100, receive output terminals 120 and 121, transmit input terminals 130 and 131, hybrid filters 10 and 11, the switches 50 and 51, filters 15, 16, 17, and 18, matching circuits 45, 46, 47, and 48, low-noise amplifiers 20 and 21, and the power amplifiers 30 and 31.

The antenna connection terminal 100 is an antenna common terminal coupled to the antenna 2.

The hybrid filters 10 and 11 are respectively an example of a first hybrid filter and an example of a second hybrid filter. The hybrid filters 10 and 11 each include one or more acoustic wave resonator elements, one or more inductors, and one or more capacitors. One terminal of the hybrid filter 10 is coupled to the antenna connection terminal 100, and the other terminal is coupled to the switch 50. One terminal of the hybrid filter 11 is coupled to the antenna connection terminal 100, and the other terminal is coupled to the switch 51. The hybrid filters 10 and 11 form a multiplexer 90.

The acoustic wave resonator element is, for example, an acoustic wave resonator element using surface acoustic waves (SAWs) or an acoustic wave resonator element using bulk acoustic waves (BAWs).

It is sufficient that the multiplexer 90 is configured to separate at least two different frequency ranges (communication bands) of radio-frequency signals. According to this, the number of filters forming the multiplexer 90 may be two or more.

Figure 2A:
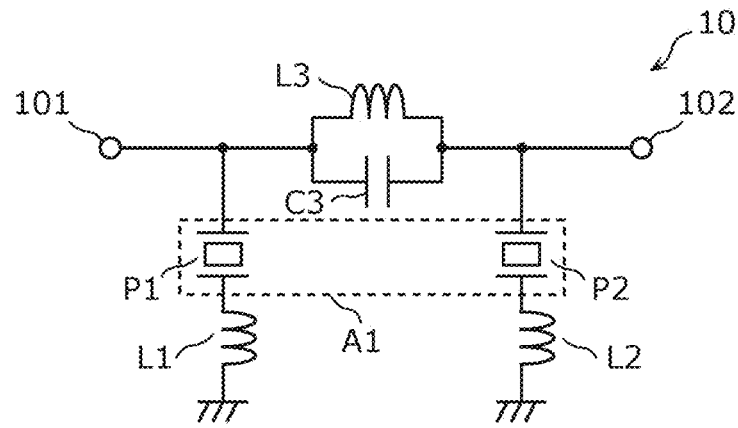
FIG. 2A illustrates an example of a circuit configuration of a first hybrid filter according to the embodiment.
Figure 2B:
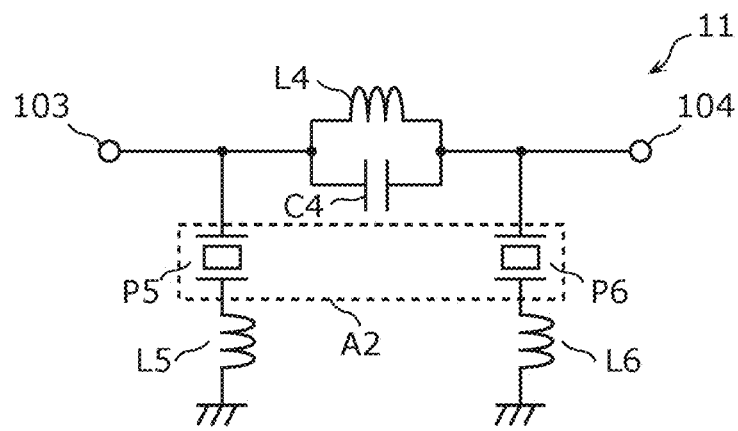
FIG. 2B illustrates an example of a circuit configuration of a second hybrid filter according to the embodiment.

FIG. 2A illustrates an example of a circuit configuration of the hybrid filter 10 according to the embodiment. FIG. 2B illustrates an example of a circuit configuration of the hybrid filter 11 according to the embodiment.

As illustrated in FIG. 2A, the hybrid filter 10 includes acoustic wave resonator elements P1 and P2, a capacitor C3, and inductors L1, L2, and L3.

The inductor L3 and the capacitor C3 form an LC parallel resonant circuit. A series circuit composed of the acoustic wave resonator element P1 and the inductor L1 is provided between the ground and a node in a path connecting an input-output terminal 101 and the LC parallel resonant circuit. A series circuit composed of the acoustic wave resonator element P2 and the inductor L2 is provided between the ground and a node in a path connecting an input-output terminal 102 and the LC parallel resonant circuit. The acoustic wave resonator elements P1 and P2 form an acoustic wave resonator A1, and the acoustic wave resonator elements P1 and P2 are, for example, integrated into one chip. The expression "a plurality of acoustic wave resonator elements are integrated into one chip" is defined such that a plurality of acoustic wave resonator elements are formed on one piezoelectric substrate, or a plurality of acoustic wave resonator elements are included in one package.

In the configuration described above, the pass band and attenuation band of the hybrid filter 10 are determined by controlling the resonant frequency of the LC parallel resonant circuit composed of the inductor L3 and the capacitor C3 and the resonant frequency and anti-resonant frequency of the acoustic wave resonator elements P1 and P2. The LC parallel resonant circuit composed of the inductor L3 and the capacitor C3 determines the pass band of the hybrid filter 10, and the acoustic wave resonator elements P1 and P2 determine attenuation poles.

As illustrated in FIG. 2B, the hybrid filter 11 has a circuit configuration similar to the hybrid filter 10, including acoustic wave resonator elements P5 and P6, a capacitor C4, and inductors L4, L5, and L6.

The inductor L4 and the capacitor C4 form an LC parallel resonant circuit. A series circuit composed of the acoustic wave resonator element P5 and the inductor L5 is provided between the ground and a node in a path connecting an input-output terminal 103 and the LC parallel resonant circuit. A series circuit composed of the acoustic wave resonator element P6 and the inductor L6 is provided between the ground and a node in a path connecting an input-output terminal 104 and the LC parallel resonant circuit. The acoustic wave resonator elements P5 and P6 form an acoustic wave resonator A2, and the acoustic wave resonator elements P5 and P6 are, for example, integrated into one chip.

In the configuration described above, the pass band and attenuation band of the hybrid filter 11 are determined by controlling the resonant frequency of the LC parallel resonant circuit composed of the inductor L4 and the capacitor C4 and the resonant frequency and anti-resonant frequency of the acoustic wave resonator elements P5 and P6. The LC parallel resonant circuit composed of the inductor L4 and the capacitor C4 determines the pass band of the hybrid filter 11, and the acoustic wave resonator elements P5 and P6 determine attenuation poles.

As a result, the hybrid filters 10 and 11, by using LC circuits, achieve wide pass bands that cannot be achieved with acoustic wave resonator elements, and by using acoustic wave resonator elements, provide steep attenuation slopes that cannot be achieved with LC circuits.

According to this, the pass band width of the hybrid filter 10 is wider than the resonance band width of the acoustic wave resonator elements P1 and P2. Similarly, the pass band width of the hybrid filter 11 is wider than the resonance band width of the acoustic wave resonator elements P5 and P6.

In the present embodiment, the resonance band width of an acoustic wave resonator element is defined as the difference between the anti-resonant frequency and resonant frequency of the acoustic wave resonator element. A fractional resonance band width is defined as the proportion obtained by dividing the resonance band width by the mean value between the anti-resonant frequency and the resonant frequency. A general SAW or BAW resonator element is known to have a frequency range of 0.1 to 10 GHZ and a 3 to 4% fractional resonance band width.

The circuit configuration of the hybrid filter according to the present embodiment is not limited to the circuit configuration of the hybrid filters 10 and 11 described above. It is sufficient that the hybrid filter according to the present embodiment includes one or more acoustic wave resonator elements, one or more inductors, and one or more capacitors; and the pass band width of the hybrid filter is wider than the resonance band width of the acoustic wave resonator element. In the circuit configuration of the hybrid filter according to the present embodiment, no switch is provided between any acoustic wave resonator element and the LC circuit. For example, in the hybrid filter 10, no switch is inserted between the LC parallel resonant circuit composed of the inductor L3 and the capacitor C3 and the acoustic wave resonator element P1 and between the LC parallel resonant circuit and the acoustic wave resonator element P2.

The filter 15 is a receive filter coupled between the switch 50 and the matching circuit 45. The filter 16 is a transmit filter coupled between the switch 50 and the matching circuit 46. The filter 17 is a receive filter coupled between the switch 51 and the matching circuit 47. The filter 18 is a transmit filter coupled between the switch 51 and the matching circuit 48. The filters 15 to 18 each may be an LC filter including an inductor and a capacitor.

Figure 2C:
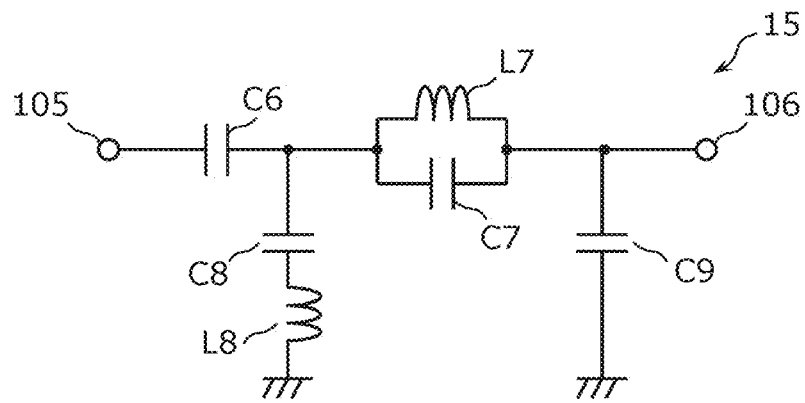
FIG. 2C illustrates an example of a circuit configuration of an LC filter according to the embodiment.

FIG. 2C illustrates an example of a circuit configuration of the filter 15 according to the embodiment. As illustrated in FIG. 2C, the filter 15 includes capacitors C6, C7, C8, and C9 and inductors L7 and L8. The filters 16 to 18 have the same circuit configuration as the filter 15.

The inductor L7 and the capacitor C7 form an LC parallel resonant circuit. The capacitor C6 is provided in series in the path connecting an input-output terminal 105 and the LC parallel resonant circuit. A series resonant circuit composed of the capacitor C8 and the inductor L8 is provided between the ground and a node in a path connecting an input-output terminal 105 and the LC parallel resonant circuit. The capacitor C9 is provided between the ground and a node in a path connecting an input-output terminal 106 and the LC parallel resonant circuit.

In the configuration described above, the pass band and attenuation band of the filter 15 are determined by controlling the resonant frequency of the LC parallel resonant circuit composed of the inductor L7 and the capacitor C7 and the resonant frequency of the LC series resonant circuit composed of the inductor L8 and the capacitor C8.

As a result, the filter 15, by using an LC parallel resonant circuit and an LC series resonant circuit, achieves a wide pass band and also provides high attenuation in the attenuation band that is far from the pass band.

The circuit configuration of the filters 15 to 18 according to the present embodiment is not limited to the circuit configuration of the filter 15 described above. It is sufficient that the filters 15 to 18 according to the present embodiment includes one or more inductors and one or more capacitors without having any acoustic wave resonator element.

The low-noise amplifier 20 amplifies receive signals in a first communication band with low noise and outputs the receive signals to the receive output terminal 120. The low-noise amplifier 21 amplifies receive signals in a second communication band with low noise and outputs the receive signals to the receive output terminal 121.

The power amplifier 30 amplifies transmit signals in the first communication band inputted from the transmit input terminal 130. The power amplifier 31 amplifies transmit signals in the second communication band inputted from the transmit input terminal 131.

The matching circuit 45 is coupled between the low-noise amplifier 20 and the filter 15. The matching circuit 45 provides impedance matching between the low-noise amplifier 20 and the filter 15. The matching circuit 46 is coupled between the power amplifier 30 and the filter 16. The matching circuit 46 provides impedance matching between the power amplifier 30 and the filter 16. The matching circuit 47 is coupled between the low-noise amplifier 21 and the filter 17. The matching circuit 47 provides impedance matching between the low-noise amplifier 21 and the filter 17. The matching circuit 48 is coupled between the power amplifier 31 and the filter 18. The matching circuit 48 provides impedance matching between the power amplifier 31 and the filter 18.

The switch 50 has a common terminal and two selection terminals. The common terminal of the switch 50 is coupled to the hybrid filter 10. One of the selection terminals of the switch 50 is coupled to the filter 15, and the other of the selection terminals of the switch 50 is coupled to the filter 16. Specifically, the switch 50 is a time division duplex (TDD) switch for selectively connecting the hybrid filter 10 to the low-noise amplifier 20 or the power amplifier 30. The switch 50 is implemented by, for example, a single-pole double-throw (SPDT) switching circuit.

The switch 51 has a common terminal and two selection terminals. The common terminal of the switch 51 is coupled to the hybrid filter 11. One of the selection terminals of the switch 51 is coupled to the filter 17, and the other of the selection terminals of the switch 51 is coupled to the filter 18. Specifically, the switch 51 is a TDD switch for selectively connecting the hybrid filter 11 to the low-noise amplifier 21 or the power amplifier 31. The switch 51 is implemented by, for example, an SPDT switching circuit.

The filters 15 and 16 may be implemented by one TDD filter and coupled between the hybrid filter 10 and the switch 50. The filters 17 and 18 may be implemented as one TDD filter and coupled between the hybrid filter 11 and the switch 51. The filters 15 to 18 and the matching circuits 45 to 48 are not necessarily included.

The filters 15 and 16 may be implemented as one duplexer for providing transfer in accordance with a frequency division duplex (FDD) method. In this case, the switch 50 is unnecessary. The filters 17 and 18 may be implemented as one duplexer for providing transfer in accordance with an FDD method. In this case, the switch 51 is unnecessary.

The low-noise amplifiers 20 and 21 and the switches 50 and 51 may be formed in one semiconductor integrated circuit (IC). The semiconductor IC may be implemented by, for example, a complementary metal-oxide semiconductor (CMOS) circuit. Specifically, the semiconductor IC is produced by a silicon on insulator (SOI) process. In this manner, the semiconductor ICs can be inexpensively manufactured. The semiconductor IC may be made of at least any of GaAs, SiGe, and GaN. This enables output of radio-frequency signals with high amplification performance and low-noise performance.

With the circuit configuration described above, the radio-frequency module 1 is operable to solely transfer a transmit signal or receive signal in the first communication band and also operable to solely transfer a transmit signal or receive signal in the second communication band. The radio-frequency module 1 is also operable to simultaneously transfer a transmit signal or receive signal in the first communication band and a transmit signal or receive signal in the second communication band.

It is sufficient that the radio-frequency module 1 according to the present embodiment includes, of the circuit components and circuit elements illustrated in FIG. 1, at least the multiplexer 90, the low-noise amplifiers 20 and 21, and the matching circuits 45 and 47. Alternatively, it is sufficient that the radio-frequency module 1 according to the present embodiment includes, of the circuit components and circuit elements illustrated in FIG. 1, at least the multiplexer 90 and the switches 50 and 51.

Because the hybrid filter described above is formed by an acoustic wave resonator-inductor-capacitor combination, the hybrid filter includes many components. As a result, a problem arises in which the hybrid filter is relatively large in size. If the mounting density is increased for the purpose of reducing the size, another problem arises in which unnecessary coupling between components occurs, and the bandpass characteristic of the hybrid filter deteriorates.

In this respect, the following describes configurations of the hybrid filter 10 of a smaller size in which degradation of the bandpass characteristic is suppressed, and the multiplexer 90 and the radio-frequency module 1.

[2. Arrangement of Circuit Elements of Radio-Frequency Module 1A According to First Example]

Figure 3A:
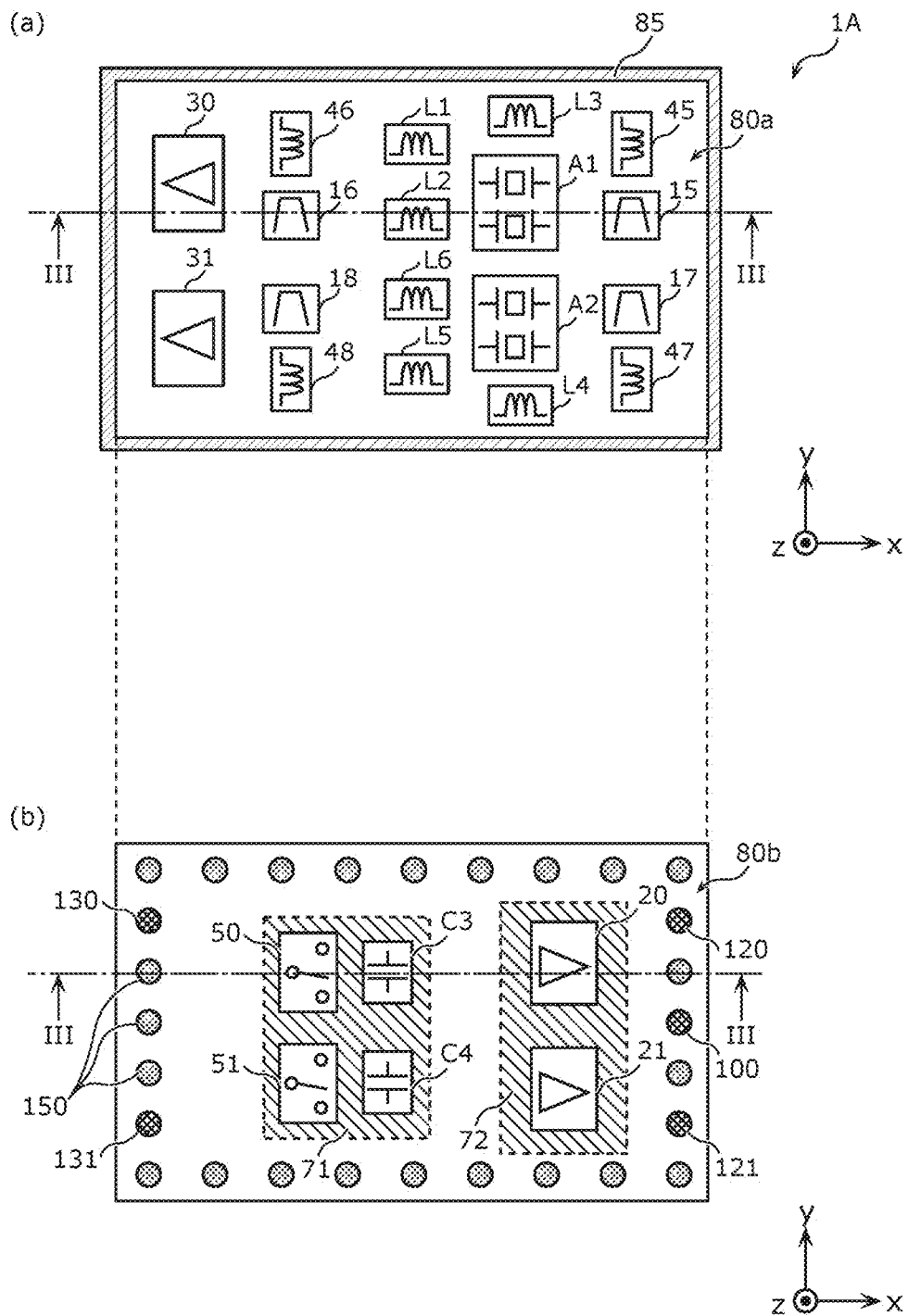
FIG. 3A provides schematic plan views of a configuration of a radio-frequency module according to a first example.
Figure 3B:
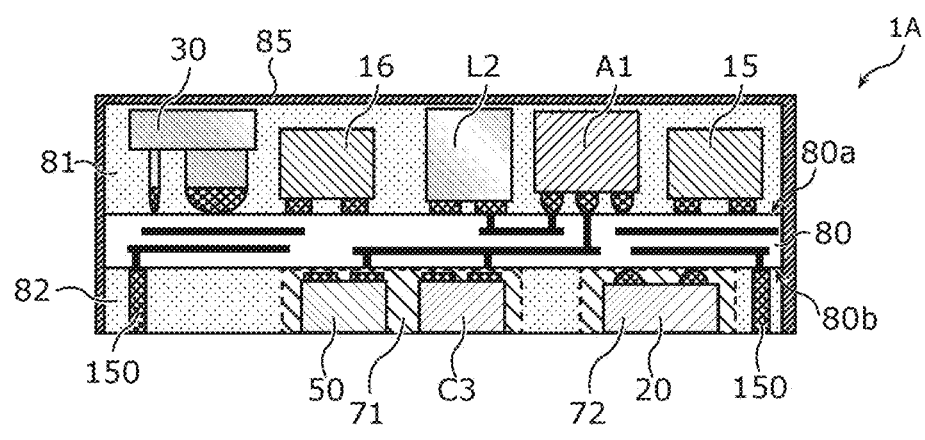
FIG. 3B is a schematic sectional view of the configuration of the radio-frequency module according to the first example.

FIG. 3A provides schematic plan views of a configuration of a radio-frequency module 1A according to a first example. FIG. 3B is a schematic sectional view of the configuration of the radio-frequency module 1A according to the first example, more specifically, a sectional view taken along line III-III in FIG. 3A. In FIG. 3A, (a) illustrates an arrangement of circuit components when, of major surfaces 80a and 80b of a module substrate 80 that are opposite to each other, the major surface 80a is viewed from the front side in the positive direction of the z axis. In FIG. 3A, (b) provides a cutaway view of the arrangement of circuit components when the major surface 80b is viewed from the front side in the positive direction of the z axis. In FIG. 3A, for ease of understanding of the positional relationship among the circuit components, the individual circuit components are assigned corresponding symbols representing the function of each circuit component, although the symbols are not displayed in the radio-frequency module 1A in actual applications.

The radio-frequency module 1A according to the first example specifically presents an arrangement of the circuit elements of the radio-frequency module 1 according to the embodiment.

As illustrated in FIGS. 3A and 3B, the hybrid filter 10 according to this example includes the module substrate 80 as well as the acoustic wave resonator elements, inductors, and capacitor. In addition to the circuit configuration illustrated in FIG. 1, the radio-frequency module 1A according to this example further includes the module substrate 80, resin members 81 and 82, external connection terminals 150, and a metal shield layer 85.

The module substrate 80 is an example of a substrate. The module substrate 80 has the major surface 80a and the major surface 80b that are opposite to each other. On the module substrate 80, the circuit components constituting the radio-frequency module 1A are mounted. As the module substrate 80, for example, a low temperature co-fired ceramics (LTCC) substrate having a layered structure composed of a plurality of dielectric layers, a high temperature co-fired ceramics (HTCC) substrate, a component-embedded substrate, a substrate including a redistribution layer (RDL), or a printed-circuit board is used.

In this example, the major surface 80a corresponds to a first major surface, and the major surface 80b corresponds to a second major surface.

It is desirable that the module substrate 80 have a multilayer structure including a plurality of dielectric layers stacked, and a ground electrode pattern be formed at least one of the plurality of dielectric layers. This improves the electromagnetic field blocking capability of the module substrate 80.

As illustrated in (b) of FIG. 3A, the antenna connection terminal 100, the transmit input terminals 130 and 131, and the receive output terminals 120 and 121 may be formed at the major surface 80b.

The resin member 81 is disposed at the major surface 80a to cover a portion of the circuit components constituting the radio-frequency module 1A and the major surface 80a. The resin member 82 is disposed at the major surface 80b to cover a portion of the circuit components constituting the radio-frequency module 1A and the major surface 80b. The resin members 81 and 82 have the function of maintaining the security of the properties of the circuit components constituting the radio-frequency module 1A such as mechanical strength and moisture resistance.

The metal shield layer 85 covers the surface of the resin member 81. The metal shield layer 85 is set at a ground potential. The metal shield layer 85 is, for example, a metal thin film formed by sputtering.

The resin members 81 and 82 and the metal shield layer 85 are non-essential constituent elements in the radio-frequency module 1 according to the present embodiment.

In this example, the matching circuits 45, 46, 47, and 48 each include an inductor.

The inductors L1, L2, L3, L4, L5, and L6, which constitute the hybrid filter 10 or 11, are an example of a first inductor that is disposed at the module substrate 80. The capacitors C3 and C4, which constitute the hybrid filter 10 or 11, are an example of a first capacitor that is disposed at the module substrate 80.

Although not illustrated in FIG. 3A, interconnections connecting the circuit components illustrated in FIG. 1 are formed inside the module substrate 80 and at the major surfaces 80a and 80b. The interconnections may be bonding wires with ends joined to the major surfaces 80a and 80b and any of the circuit components constituting the radio-frequency module 1A, or connectors, electrodes, or wires that are formed on the surface of the circuit components constituting the radio-frequency module 1A.

As illustrated in FIG. 3A, in the radio-frequency module 1A according to this example, the acoustic wave resonators A1 and A2 and the inductors L1, L2, L3, L4, L5, and L6 are an example of a first circuit element, disposed at the major surface 80a; the capacitors C3 and C4 are an example of a second circuit element, disposed at the major surface 80b.

In the configuration described above, the acoustic wave resonator A1 and the inductors L1 to L3, and the capacitor C3, which constitute the hybrid filter 10, are disposed across the module substrate 80, separately on both sides of the module substrate. This arrangement reduces the size of the hybrid filter 10. Further, unnecessary coupling between the acoustic wave resonator A1 and the inductors L1 to L3, and the capacitor C3 is hindered. As a result, it is possible to provide the hybrid filter 10 of a smaller size in which degradation of the bandpass characteristic is suppressed.

Similarly, the acoustic wave resonator A2 and the inductors L4 to L6, and the capacitor C4, which constitute the hybrid filter 11, are disposed across the module substrate 80, separately on both sides of the module substrate. As a result, it is possible to provide the hybrid filter 11 of a smaller size in which degradation of the bandpass characteristic is suppressed.

Furthermore, it is possible to provide the multiplexer 90 of a smaller size in which degradation of the bandpass characteristic is suppressed.

It is sufficient that in either the hybrid filter 10 or 11, the first circuit element and the second circuit element are disposed across the module substrate 80, separately on both sides of the module substrate. As a result, it is possible to provide the hybrid filter 10 or 11 in which degradation of the bandpass characteristic is suppressed.

In the radio-frequency module 1A according to this example, the power amplifiers 30 and 31, the filters 15 to 18, and the matching circuits 45 to 48 are disposed at the major surface 80a, whereas the low-noise amplifiers 20 and 21 and the switches 50 and 51 are disposed at the major surface 80b.

In the radio-frequency module 1A according to this example, a plurality of external connection terminals 150 are disposed at the major surface 80b. The radio-frequency module 1A exchanges electrical signals with an external substrate provided on the front side in the negative direction of the z axis with respect to the radio-frequency module 1A, through the plurality of external connection terminals 150. Some of the external connection terminals 150 are set at the ground potential of the external substrate. Of the major surfaces 80a and 80b, at the major surface 80b facing the external substrate, circuit components that cannot be easily formed as low-profile structures are not disposed, but the low-noise amplifiers 20 and 21 and the switches 50 and 51, which can be easily formed as low-profile structures, are disposed at the major surface 80b facing the external substrate.

The external connection terminals 150 may be columnar electrodes extended in the Z-axis direction through the resin member 82 as illustrated in FIGS. 3A and 3B. Alternatively, the external connection terminals 150 may be bump electrodes formed on the major surface 80b. In this case, the resin member 82 on the major surface 80b is not necessarily provided.

In the radio-frequency module 1A according to this example, the capacitors C3 and C4 and the switches 50 and 51 are included in one semiconductor IC 71. As a result, the capacitors C3 and C4 and the switches 50 and 51 have small-size low-profile structures.

The capacitors C3 and C4 may be, for example, integrated passive devices (IPDs) disposed inside a Si substrate or at a surface of the Si substrate in an integrated manner. As a result, because the capacitors C3 and C4 are implemented by IPDs, which can be formed as low-profile structures, it is possible to reduce the height of the portion on the major surface 80b side.

In the radio-frequency module 1A according to this example, the power amplifiers 30 and 31 are disposed at the major surface 80a, whereas the low-noise amplifiers 20 and 21 are disposed at the major surface 80b. In this arrangement, amplifiers for transmission and amplifiers for reception are disposed across the module substrate 80, and thus, the isolation between the transmit and receive sides in the radio-frequency module 1A is improved.

In the radio-frequency module 1A according to this example, the low-noise amplifiers 20 and 21 are included in one semiconductor IC 72. As a result, the low-noise amplifiers 20 and 21 have small-size low-profile structures.

The amount of heat generation of the power amplifiers 30 and 31 is relatively large among the circuit components included in the radio-frequency module 1A. To enhance the heat dissipation capability of the radio-frequency module 1A, it is important to dissipate heat generated in the power amplifiers 30 and 31 along heat dissipation paths of a low thermal resistance to an external substrate. If the power amplifiers 30 and 31 are arranged on the major surface 80b, electrode wires coupled to the power amplifiers 30 and 31 are disposed at the major surface 80b. As a result, the heat dissipation paths include heat dissipation paths routed via only planar interconnection patterns (along an xy plane) on the major surface 80b. The planar interconnection patterns are formed by a metal thin film, and thus, the thermal resistance of the planar interconnection patterns is relatively high. As a result, if the power amplifiers 30 and 31 are disposed at the major surface 80b, the heat dissipation capability is degraded.

In this respect, in the radio-frequency module 1A according to this example, the power amplifiers 30 and 31 can be coupled to the external connection terminals 150 by via-conductors for heat dissipation coupled to ground electrodes of the power amplifiers 30 and 31, extended from the major surface 80a to the major surface 80b. As such, the heat dissipation paths of the power amplifiers 30 and 31 do not include heat dissipation paths routed via only planar interconnection patterns along an xy plane, the thermal resistance of which is relatively high among the interconnections in the module substrate 80. As a result, it is possible to provide the radio-frequency module 1A of a smaller size with an improved capability of dissipating heat from the power amplifiers 30 and 31 to an external substrate.

In the radio-frequency module 1A according to this example, it is necessary that one of the acoustic wave resonator elements P1 and P2 and the inductors L1, L2, and L3 is disposed at the major surface 80a, and the capacitor C3 is disposed at the major surface 80b; the other circuit components may be disposed at either of the major surfaces 80a and 80b.

In the radio-frequency module 1A according to this example, either one of the hybrid filters 10 and 11 may have a pass band including at least one of the followings: Fourth Generation Long-Term Evolution (4G-LTE) Band 42 (3400-3600 MHz), Band 43 (3600-3800 MHZ), Band 48 (3550-3700 MHZ), Band 49 (3550-3700 MHZ), Fifth Generation New Radio (5G-NR) n77 (3300-4200 MHZ), n78 (3300-3800 MHZ), n79 (4400-5000 MHZ), n46 (5150-5925 MHZ), n96 (5925-7125 MHZ), n97, Wireless Local Area Network (WLAN) (5150-5350 MHZ), WLAN (5470-5850 MHz), or WLAN (5925-7125 MHZ).

As a result, the hybrid filter 10 or 11 having wide-band and steep filter characteristics is usable for the above communication bands that are wide ranges close to adjacent bands.

In the radio-frequency module 1A according to this example, the pass band of the hybrid filter 10 may include 5G-NR n79, and the pass band of the hybrid filter 11 may include at least one selected from 4GLTE Band 42, Band 43, Band 48, Band 49, 5G-NR n77, and n78.

[3. Arrangement of Circuit Elements of Radio-Frequency Module 1B According to Second Example]

Figure 4:
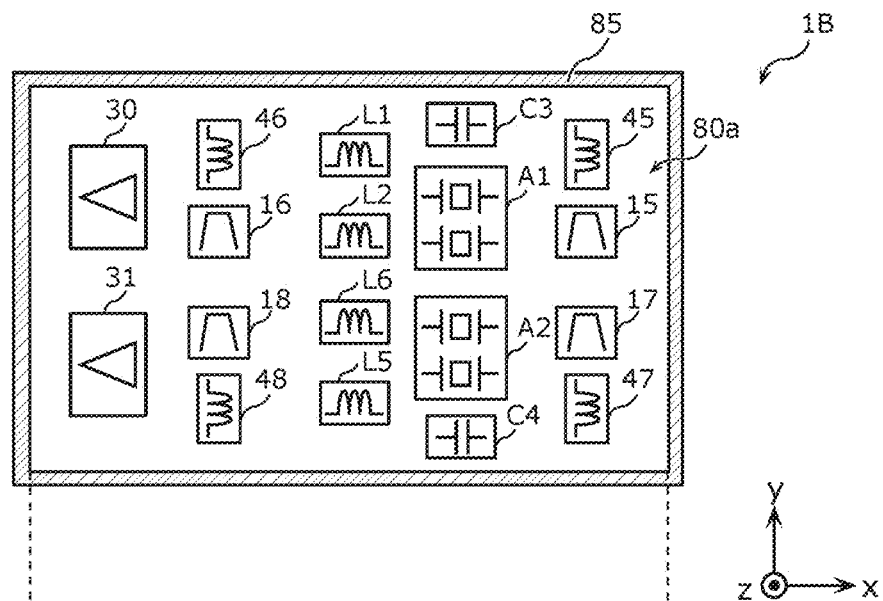
FIG. 4 provides schematic plan views of a configuration of a radio-frequency module according to a second example.
Figure 4:
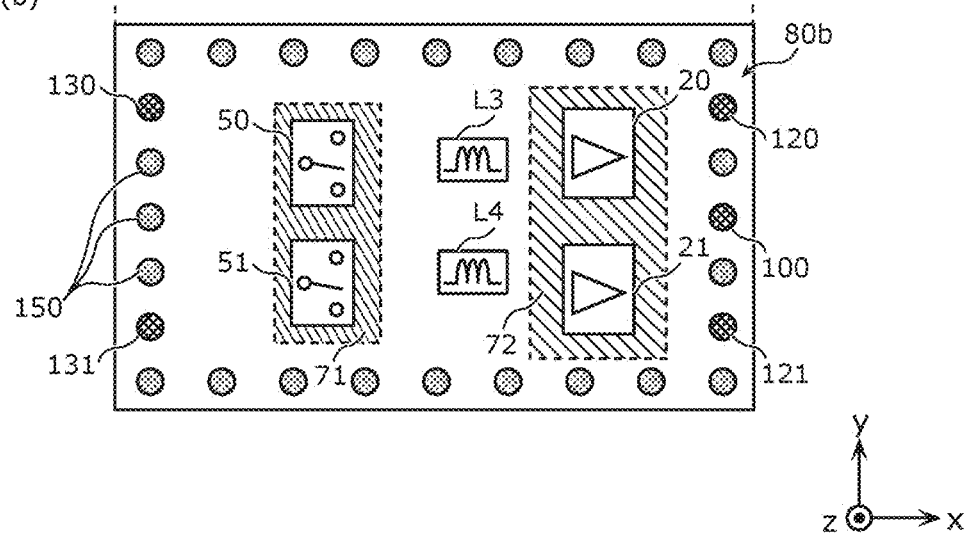

FIG. 4 provides schematic plan views of a configuration of a radio-frequency module 1B according to a second example. In FIG. 4, (a) illustrates an arrangement of circuit components when, of major surfaces 80a and 80b of a module substrate 80 that are opposite to each other, the major surface 80a is viewed from the front side in the positive direction of the z axis. In FIG. 4, (b) provides a cutaway view of the arrangement of circuit components when the major surface 80b is viewed from the front side in the positive direction of the z axis. In FIG. 4, for ease of understanding of the positional relationship among the circuit components, the individual circuit components are assigned corresponding symbols representing the function of each circuit component, although the symbols are not displayed in the radio-frequency module 1B in actual applications.

The radio-frequency module 1B according to the second example specifically presents an arrangement of the circuit elements of the radio-frequency module 1 according to the embodiment.

The radio-frequency module 1B according to this example differs from the radio-frequency module 1A according to the first example in the arrangement of the circuit components constituting the hybrid filters 10 and 11. The following describes the radio-frequency module 1B according to this example with a main focus on configurations different from the radio-frequency module 1A according to the first example, and descriptions of the same configurations as the radio-frequency module 1A according to the first practical example are not repeated.

As illustrated in FIG. 4, in the radio-frequency module 1B according to this example, the acoustic wave resonators A1 and A2, the inductors L1, L2, L5, and L6, and the capacitors C3 and C4 are an example of the first circuit element, disposed at the major surface 80a; the inductors L3 and L4 are an example of the second circuit element, disposed at the major surface 80b.

In the configuration described above, the acoustic wave resonator A1, the inductors L1 and L2, and the capacitor C3, and the inductor L3, which constitute the hybrid filter 10, are disposed across the module substrate 80, separately on both sides of the module substrate. This arrangement reduces the size of the hybrid filter 10. Further, unnecessary coupling between the acoustic wave resonator A1, the inductors L1 and L2, and the capacitor C3, and the inductor L3 is hindered. As a result, it is possible to provide the hybrid filter 10 of a smaller size in which degradation of the bandpass characteristic is suppressed.

Similarly, the acoustic wave resonator A2, the inductors L5 and L6, and the capacitor C4, and the inductor L4, which constitute the hybrid filter 11, are disposed across the module substrate 80, separately on both sides of the module substrate. As a result, it is possible to provide the hybrid filter 11 of a smaller size in which degradation of the bandpass characteristic is suppressed.

Furthermore, it is possible to provide the multiplexer 90 of a smaller size in which degradation of the bandpass characteristic is suppressed.

In the radio-frequency module 1B according to this example, the switches 50 and 51 are included in the one semiconductor IC 71. As a result, the switches 50 and 51 have small-size low-profile structures.

The inductors L3 and L4 may be, for example, IPDs disposed inside a Si substrate or at a surface of the Si substrate in an integrated manner. As a result, because the inductors L3 and L4 are implemented by IPDs, which can be formed as low-profile structures, it is possible to reduce the height of the portion on the major surface 80b side.

In the radio-frequency module 1B according to this example, it is necessary that one of the acoustic wave resonator elements P1 and P2 and the capacitor C3 is disposed at the major surface 80a, and one of the inductors L1, L2, and L3 is disposed at the major surface 80b; the other circuit components may be disposed at either of the major surfaces 80a and 80b.

[4. Arrangement of Circuit Elements of Radio-Frequency Module 1C According to Third Example]

Figure 5:
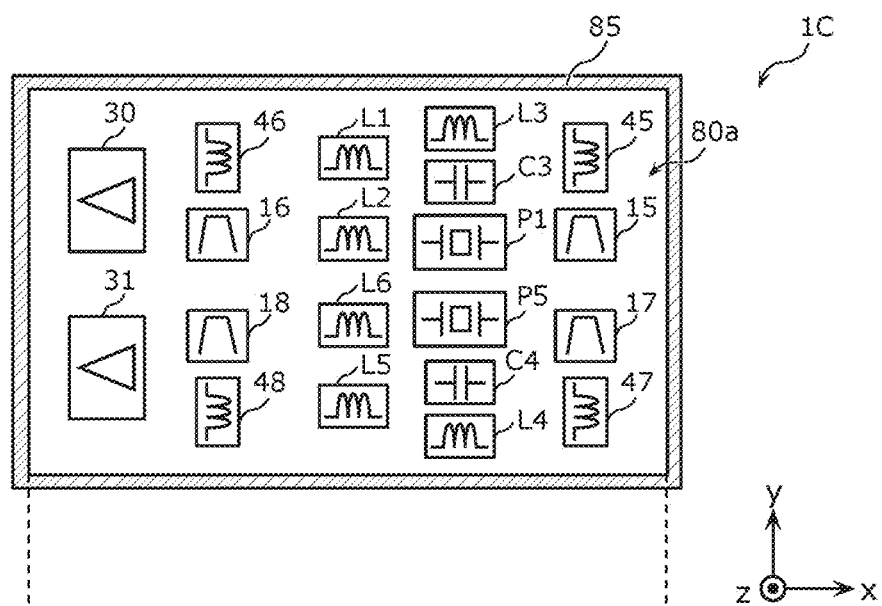
FIG. 5 provides schematic plan views of a configuration of a radio-frequency module according to a third example.
Figure 5:
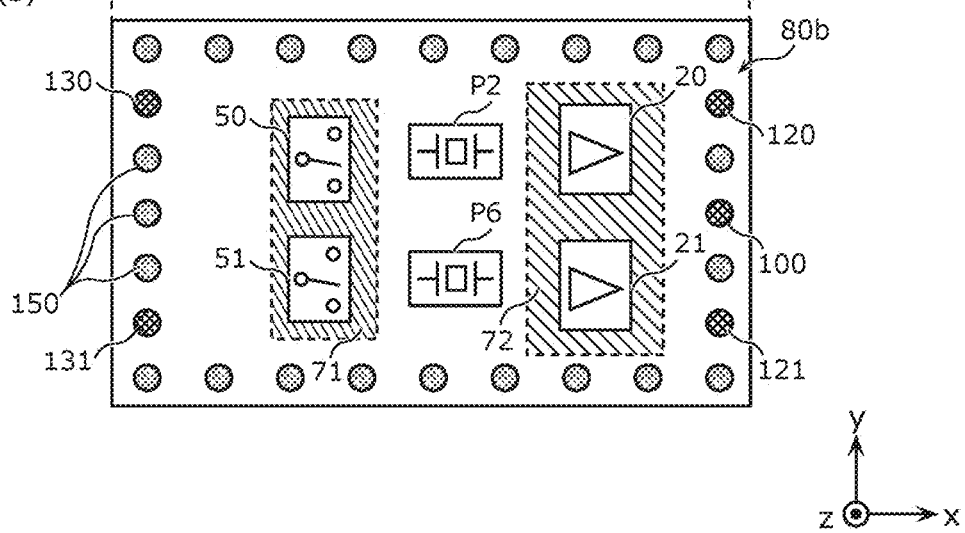

FIG. 5 provides schematic plan views of a configuration of a radio-frequency module 1C according to a third example. In FIG. 5, (a) illustrates an arrangement of circuit components when, of major surfaces 80a and 80b of a module substrate 80 that are opposite to each other, the major surface 80a is viewed from the front side in the positive direction of the z axis. In FIG. 5, (b) provides a cutaway view of the arrangement of circuit components when the major surface 80b is viewed from the front side in the positive direction of the z axis. In FIG. 5, for ease of understanding of the positional relationship among the circuit components, the individual circuit components are assigned corresponding symbols representing the function of each circuit component, although the symbols are not displayed in the radio-frequency module 1C in actual applications.

The radio-frequency module 1C according to the third example specifically presents an arrangement of the circuit elements of the radio-frequency module 1 according to the embodiment.

The radio-frequency module 1C according to this example differs from the radio-frequency module 1A according to the first example in the arrangement of the circuit components constituting the hybrid filters 10 and 11. The following describes the radio-frequency module 1C according to this example with a main focus on configurations different from the radio-frequency module 1A according to the first example, and descriptions of the same configurations as the radio-frequency module 1A according to the first practical example are not repeated.

As illustrated in FIG. 5, in the radio-frequency module 1C according to this example, the acoustic wave resonator elements P1 and P5, the inductors L1, L2, L3, L4, L5, and L6, and the capacitors C3 and C4 are an example of the first circuit element, disposed at the major surface 80a; the acoustic wave resonator elements P2 and P6 are an example of the second circuit element, disposed at the major surface 80b.

In the configuration described above, the acoustic wave resonator element P1, the inductors L1 to L3, and the capacitor C3, and the acoustic wave resonator element P2, which constitute the hybrid filter 10, are disposed across the module substrate 80, separately on both sides of the module substrate. This arrangement reduces the size of the hybrid filter 10. Further, unnecessary coupling between the acoustic wave resonator element P1, the inductors L1 to L3, and the capacitor C3, and the acoustic wave resonator element P2 is hindered. As a result, it is possible to provide the hybrid filter 10 of a smaller size in which degradation of the bandpass characteristic is suppressed.

Similarly, the acoustic wave resonator element P5, the inductors L4 to L6, and the capacitor C4, and the acoustic wave resonator element P6, which constitute the hybrid filter 11, are disposed across the module substrate 80, separately on both sides of the module substrate. As a result, it is possible to provide the hybrid filter 11 of a smaller size in which degradation of the bandpass characteristic is suppressed.

Furthermore, it is possible to provide the multiplexer 90 of a smaller size in which degradation of the bandpass characteristic is suppressed.

In the radio-frequency module 1C according to this example, the switches 50 and 51 are included in the one semiconductor IC 71. As a result, the switches 50 and 51 have small-size low-profile structures.

In the radio-frequency module 1C according to this example, it is necessary that the acoustic wave resonator element P1 is disposed at the major surface 80a, and the acoustic wave resonator element P2 is disposed at the major surface 80b; the other circuit components may be disposed at either of the major surfaces 80a and 80b.

[5. Arrangement of Circuit Elements of Radio-Frequency Module 1D According to Fourth Example]

Figure 6:
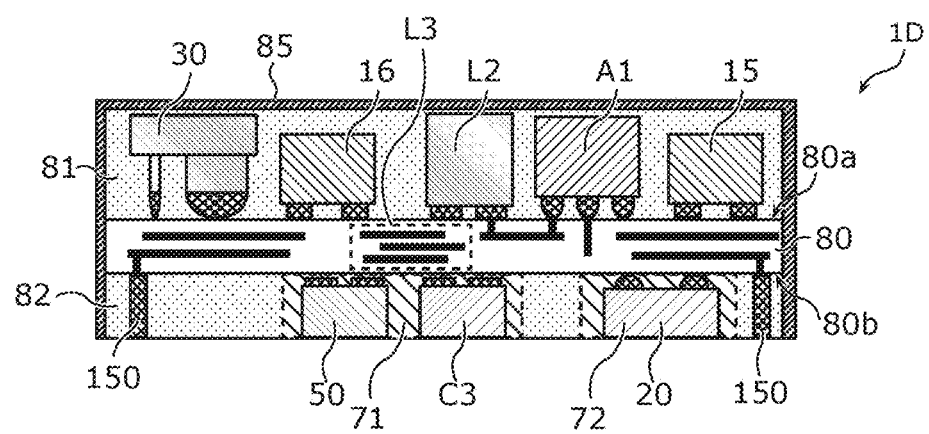
FIG. 6 is a schematic sectional view of a configuration of a radio-frequency module according to a fourth example.
Figure 6:
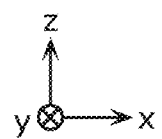

FIG. 6 is a schematic sectional view of a configuration of a radio-frequency module 1D according to a fourth example. The radio-frequency module 1D according to the fourth example specifically presents an arrangement of the circuit elements of the radio-frequency module 1 according to the embodiment.

The radio-frequency module 1D according to this example differs from the radio-frequency module 1A according to the first example in the arrangement of the circuit components constituting the hybrid filter 10. The following describes the radio-frequency module 1D according to this example with a main focus on configurations different from the radio-frequency module 1A according to the first example, and descriptions of the same configurations as the radio-frequency module 1A according to the first practical example are not repeated.

As illustrated in FIG. 6, in the radio-frequency module 1D according to this example, the acoustic wave resonators A1 and A2 and the inductors L1, L2, L4, L5, and L6 are an example of the first circuit element, disposed at the major surface 80a; the capacitors C3 and C4 are an example of the second circuit element, disposed at the major surface 80b.

In the configuration described above, the acoustic wave resonator A1 and the inductors L1 and L2, and the capacitor C3, which constitute the hybrid filter 10, are disposed across the module substrate 80, separately on both sides of the module substrate. This arrangement reduces the size of the hybrid filter 10. Further, unnecessary coupling between the acoustic wave resonator A1 and the inductors L1 and L2, and the capacitor C3 is hindered. As a result, it is possible to provide the hybrid filter 10 of a smaller size in which degradation of the bandpass characteristic is suppressed.

Similarly, the acoustic wave resonator A2 and the inductors L4 to L6, and the capacitor C4, which constitute the hybrid filter 11, are disposed across the module substrate 80, separately on both sides of the module substrate. As a result, it is possible to provide the hybrid filter 11 of a smaller size in which degradation of the bandpass characteristic is suppressed.

It is sufficient that in either the hybrid filter 10 or 11, the first circuit element and the second circuit element are disposed across the module substrate 80, separately on both sides of the module substrate. As a result, it is possible to provide the hybrid filter 10 or 11 in which degradation of the bandpass characteristic is suppressed.

As illustrated in FIG. 6, the inductor L3 is formed inside the module substrate 80.

This arrangement further reduces the size of the hybrid filter 10. At least one of the inductors L1 to L3 and the capacitor C3, which constitute the hybrid filter 10, may be formed inside the module substrate 80. At least one of the inductors L4 to L6 and the capacitor C4, which constitute the hybrid filter 11, may be formed inside the module substrate 80.

[6. Arrangement of Circuit Elements of Radio-Frequency Modules According to Modifications]

In the radio-frequency modules according to the first to fourth examples, the matching circuit 45 coupled to the input terminal of the low-noise amplifier 20 is disposed at the major surface 80a. In this case, when magnetic field coupling between the inductors L1 to L3 of the hybrid filter 10 and the inductor (a second inductor) of the matching circuit 45 is relatively strong, it is assumed that a transmit signal outputted from the power amplifier 30, a harmonic wave of the transmit signal, or an intermodulation distortion can enter the receive path including the low-noise amplifier 20 through the magnetic field coupling, and the receive sensitivity can thus be degraded. In this respect, in first to third modifications, configurations are presented in which degradation of the receive sensitivity is suppressed.

Figure 7A:
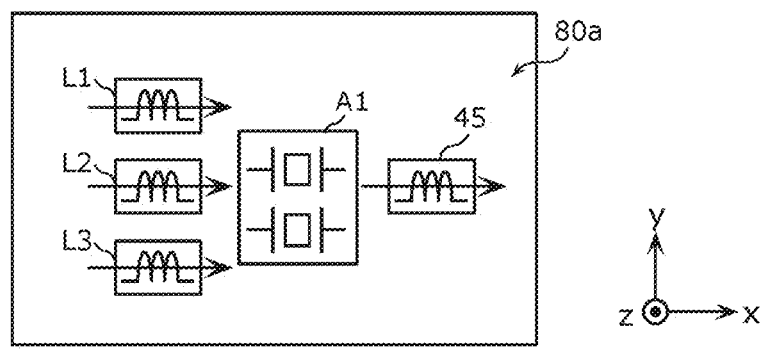
FIG. 7A is a schematic partial plan view of a configuration of a radio-frequency module according to a first modification.

FIG. 7A is a schematic partial plan view of a configuration of a radio-frequency module according to the first modification. This drawing illustrates an arrangement of circuit components in a partial area of the major surface 80a of the module substrate 80.

As illustrated in FIG. 7A, when the module substrate 80 is viewed in plan view, the acoustic wave resonator A1 is disposed between the inductors L1 to L3 and the inductor of the matching circuit 45. With this arrangement, the acoustic wave resonator A1 hinders coupling between the magnetic flux generated around the inductors L1 to L3 and the magnetic flux generated around the inductor of the matching circuit 45. As such, it is possible to reduce the likelihood of magnetic field coupling between the inductors L1 to L3 and the inductor of the matching circuit 45.

The circuit component disposed between the inductors L1 to L3 and the inductor of the matching circuit 45 is not limited to the acoustic wave resonator A1; any of the other circuit components may be disposed between the inductors L1 to L3 and the inductor of the matching circuit 45.

Figure 7B:
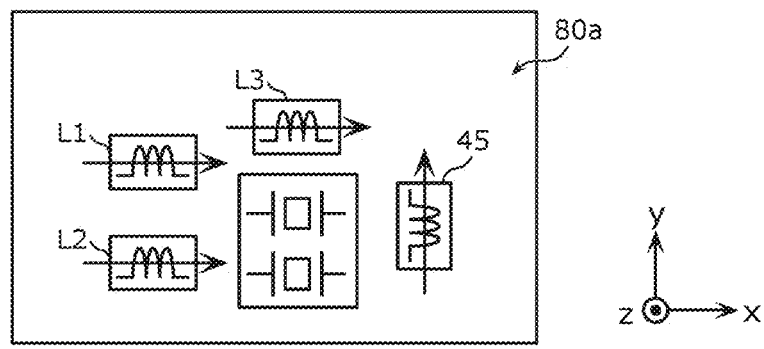
FIG. 7B is a schematic partial plan view of a configuration of a radio-frequency module according to a second modification.

FIG. 7B is a schematic partial plan view of a configuration of a radio-frequency module according to the second modification. This drawing illustrates an arrangement of circuit components in a partial area of the major surface 80a of the module substrate 80.

As illustrated in FIG. 7B, when the module substrate 80 is viewed in plan view, the winding axis direction (x-axis direction) of the inductors L1 to L3 and the winding axis direction (y-axis direction) of the inductor of the matching circuit 45 cross each other at the major surface 80a. In other words, the winding axes of the inductors L1 to L3 are not parallel with the winding axis of the inductor of the matching circuit 45. This arrangement reduces the likelihood of magnetic field coupling between the inductors L1 to L3 and the inductor of the matching circuit 45.

Figure 7C:
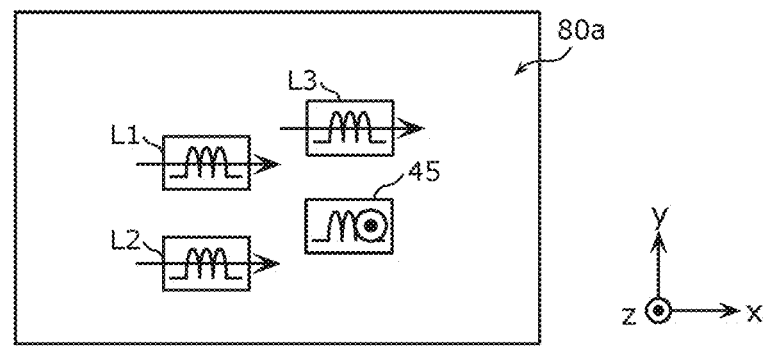
FIG. 7C is a schematic partial plan view of a configuration of a radio-frequency module according to a third modification.

FIG. 7C is a schematic partial plan view of a configuration of a radio-frequency module according to the third modification. This drawing illustrates an arrangement of circuit components in a partial area of the major surface 80a of the module substrate 80.

As illustrated in FIG. 7C, the winding axis direction (x-axis direction) of the inductors L1 to L3 and the winding axis direction (z-axis direction) of the inductor of the matching circuit 45 cross each other. In other words, the winding axes of the inductors L1 to L3 are not parallel with the winding axis of the inductor of the matching circuit 45. This arrangement reduces the likelihood of magnetic field coupling between the inductors L1 to L3 and the inductor of the matching circuit 45.

Although not illustrated in the drawings, it may be possible that the winding axes of the inductors L1 to L3 and the winding axis of the inductor of the matching circuit 45 are noncollinear. Also in this case, as compared to the case in which the winding axes of the inductors L1 to L3 and the winding axis of the inductor of the matching circuit 45 are collinear, the likelihood of magnetic field coupling between the inductors L1 to L3 and the inductor of the matching circuit 45 is reduced.

[7. Arrangement of Circuit Elements of Radio-Frequency Module 1E According to Fifth Example]

In the radio-frequency module 1 and the communication device 5, the hybrid filters 10 and 11 operate as TDD filters operable for both transmission and reception. Specifically, the hybrid filter 10 filters a receive signal received by the antenna 2 and outputs the receive signal to the receive path including the switch 50, the filter 15, the matching circuit 45, the low-noise amplifier 20, and the receive output terminal 120; the hybrid filter 10 also filters a transmit signal transferred through the transmit path including the transmit input terminal 130, the power amplifier 30, the matching circuit 46, the filter 16, and the switch 50 and outputs the transmit signal to the antenna 2. The hybrid filter 11 filters a receive signal received by the antenna 2 and outputs the receive signal to the receive path including the switch 51, the filter 17, the matching circuit 47, the low-noise amplifier 21, and the receive output terminal 121; the hybrid filter 11 also filters a transmit signal transferred through the transmit path including the transmit input terminal 131, the power amplifier 31, the matching circuit 48, the filter 18, and the switch 51 and outputs the transmit signal to the antenna 2.

In contrast, a radio-frequency module 1E according to this example includes a radio-frequency circuit 61 including the hybrid filters 10 and 11 that are operable for both transmission and reception, and additionally, a radio-frequency circuit 62 including hybrid filters 12 and 13 that are configured especially for reception. The following describes the radio-frequency module 1E and a communication device 5E according to this example with a main focus on configurations different from the radio-frequency module 1 and the communication device 5.

Figure 8:
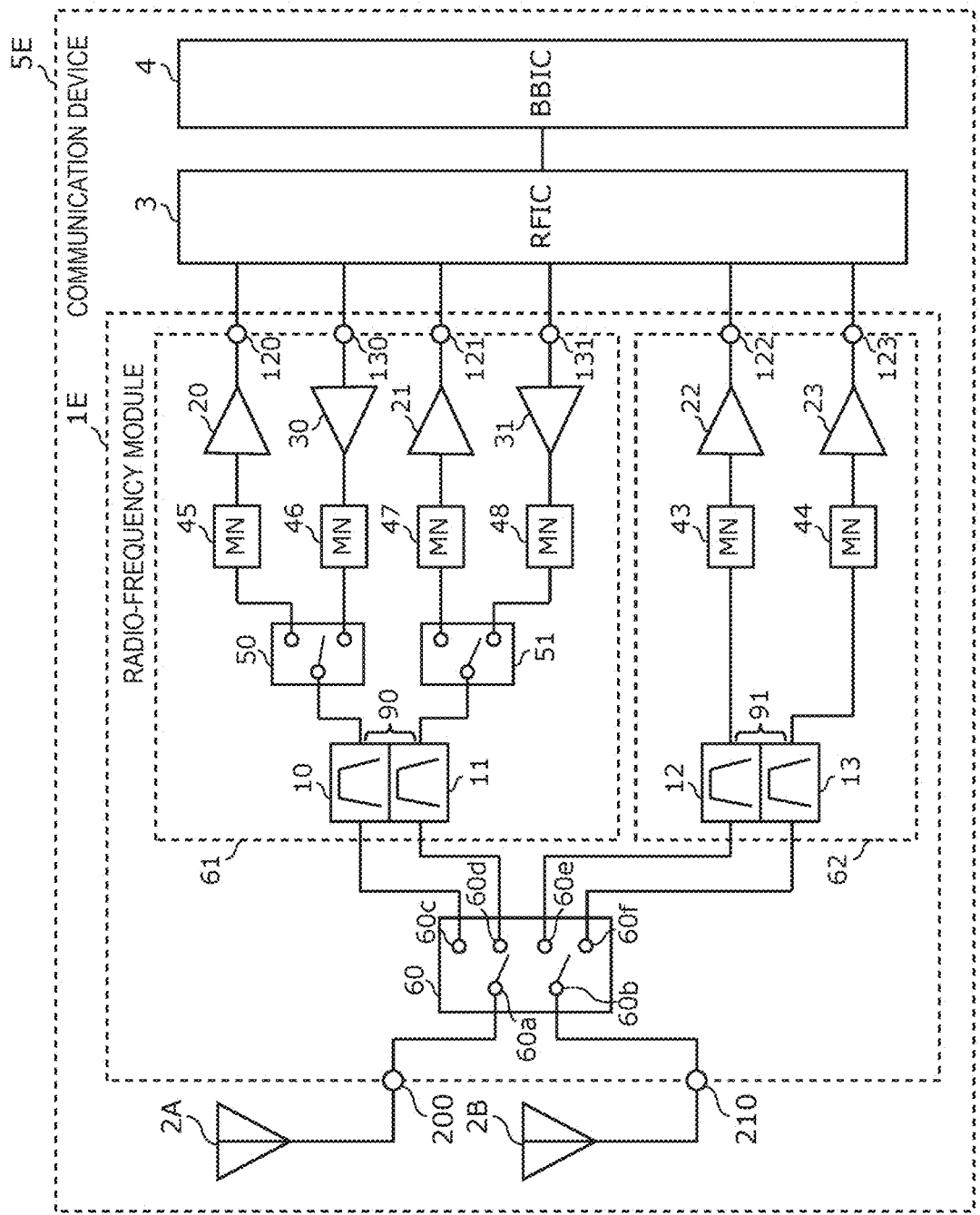
FIG. 8 is a circuit configuration diagram of a radio-frequency module and a communication device according to a fifth example.

FIG. 8 is a circuit configuration diagram of the radio-frequency module 1E and the communication device 5E according to a fifth example. As illustrated in the drawing, the communication device 5E includes the radio-frequency module 1E, antennas 2A and 2B, the RFIC 3, and the BBIC 4.

The antenna 2A is coupled to an antenna connection terminal 200 of the radio-frequency module 1E. The antenna 2A emits a radio-frequency signal outputted from the radio-frequency module 1E. The antenna 2A also receives a radio-frequency signal from outside and outputs the radio-frequency signal to the radio-frequency module 1E.

The antenna 2B is coupled to an antenna connection terminal 210 of the radio-frequency module 1E. The antenna 2B emits a radio-frequency signal outputted from the radio-frequency module 1E. The antenna 2B also receives a radio-frequency signal from outside and outputs the radio-frequency signal to the radio-frequency module 1E.

The following describes a configuration of the radio-frequency module 1E. The radio-frequency module 1E includes the antenna connection terminals 200 and 210, a switch 60, and the radio-frequency circuits 61 and 62.

The switch 60 includes common terminals 60a and 60b and selection terminals 60c, 60d, 60e, and 60f. The switch 60 controls connection and disconnection between the common terminal 60a and at least one of the selection terminals 60c to 60f and connection and disconnection between the common terminal 60b and at least one of the selection terminals 60c to 60f. The common terminal 60a is coupled to the antenna connection terminal 200. The common terminal 60b is coupled to the antenna connection terminal 210. The selection terminal 60c is coupled to the hybrid filter 10. The selection terminal 60d is coupled to the hybrid filter 11. The selection terminal 60e is coupled to the hybrid filter 12. The selection terminal 60f is coupled to the hybrid filter 13.

With the connection configuration of the switch 60 described above, in the communication device 5E, it is possible to couple the antenna 2A to at least one of the hybrid filters 10 to 13 and couple the antenna 2B to at least one of the hybrid filters 10 to 13.

The radio-frequency circuit 61 includes the receive output terminals 120 and 121, the transmit input terminals 130 and 131, the hybrid filters 10 and 11, the switches 50 and 51, the matching circuits 45, 46, 47, and 48, the low-noise amplifiers 20 and 21, and the power amplifiers 30 and 31. The radio-frequency circuit 61 may include the filters 15 to 18, which are included in the radio-frequency module 1.

The radio-frequency circuit 62 includes receive output terminals 122 and 123, the hybrid filters 12 and 13, matching circuits 43 and 44, and low-noise amplifiers 22 and 23.

The hybrid filters 12 and 13 each includes one or more acoustic wave resonator elements, one or more inductors, and one or more capacitors. One terminal of the hybrid filter 12 is coupled to the selection terminal 60e, and the other terminal is coupled to the low-noise amplifier 22 via the matching circuit 43. One terminal of the hybrid filter 13 is coupled to the selection terminal 60f, and the other terminal is coupled to the low-noise amplifier 23 via the matching circuit 44. The hybrid filters 12 and 13 form a multiplexer 91.

The acoustic wave resonator elements included in the hybrid filters 12 and 13 are, for example, acoustic wave resonator elements using SAWs or acoustic wave resonator elements using BAWs.

It is sufficient that the multiplexer 91 is configured to separate at least two different frequency ranges (communication bands) of radio-frequency signals. According to this, the number of filters forming the multiplexer 91 may be two or more.

The specific circuit configuration of the hybrid filters 12 and 13 is exemplified by the circuit configurations illustrated in FIGS. 2A and 2B.

The low-noise amplifier 22 amplifies receive signals in, for example, the first communication band with low noise and outputs the receive signals to the receive output terminal 122. The low-noise amplifier 23 amplifies receive signals in, for example, the second communication band with low noise and outputs the receive signals to the receive output terminal 123.

The matching circuit 43 is coupled between the low-noise amplifier 22 and the hybrid filter 12. The matching circuit 43 provides impedance matching between the low-noise amplifier 22 and the hybrid filter 12. The matching circuit 44 is coupled between the low-noise amplifier 23 and the hybrid filter 13. The matching circuit 44 provides impedance matching between the low-noise amplifier 23 and the hybrid filter 13.

The low-noise amplifiers 22 and 23 may be formed in one semiconductor IC. The semiconductor IC may be implemented by, for example, a CMOS circuit. Specifically, the semiconductor IC is produced by an SOI process. In this manner, the semiconductor ICs can be inexpensively manufactured. The semiconductor IC may be made of at least any of GaAs, SiGe, and GaN. This enables output of radio-frequency signals with high amplification performance and low-noise performance.

The low-noise amplifiers 20, 21, 22, and 23 may be formed in one semiconductor IC. The low-noise amplifiers 22 and 23 and the switch 60 may be formed in one semiconductor IC.

With the circuit configuration described above, the radio-frequency module 1E is operable to transfer at least one signal selected from the group consisting of a transmit signal and two kinds of receive signals in the first communication band and also operable to transfer at least one signal selected from the group consisting of a transmit signal and two kinds of receive signals in the second communication band. The radio-frequency module 1E is also operable to simultaneously transfer at least two signals selected from the group consisting of a transmit signal and receive signals in the first communication band and a transmit signal and receive signals in the second communication band.

The circuit elements constituting the radio-frequency module 1E according to this example are disposed at the major surface 80a or 80b of the module substrate 80 or inside the module substrate 80.

The circuit elements constituting the radio-frequency circuit 61 are disposed, for example, in the same arrangement as FIGS. 3A and 3B. Specifically, the acoustic wave resonators A1 and A2 and the inductors L1, L2, L3, L4, L5, and L6 are disposed at the major surface 80a, and the capacitors C3 and C4 are disposed at the major surface 80b.

The circuit elements constituting the radio-frequency circuit 62 may be disposed at the major surface 80a or 80b of the module substrate 80 or inside the module substrate 80.

In the configuration described above, the acoustic wave resonator A1 and the inductors L1 to L3, and the capacitor C3, which constitute the hybrid filter 10, are disposed across the module substrate 80, separately on both sides of the module substrate. Similarly, the acoustic wave resonator A2, the inductors L4 to L6, and the capacitor C4, which constitute the hybrid filter 11, are disposed across the module substrate 80, separately on both sides of the module substrate. This arrangement reduces the size of the hybrid filters 10 and 11 and consequently reduces the size of the radio-frequency module 1E and the size of the communication device 5E. Furthermore, this arrangement hinders unnecessary coupling between the acoustic wave resonator A1 and the inductors L1 to L3, and the capacitor C3 and also hinders unnecessary coupling between the acoustic wave resonator A2 and the inductors L4 to L6, and the capacitor C4. As a result, it is possible to provide the radio-frequency module 1E and the communication device 5E including the hybrid filters 10 and 11 in which degradation of the bandpass characteristic is suppressed.

It is desirable that the switch 60 be disposed at the major surface 80b of the module substrate 80. It is also desirable that the switch 60 as well as the capacitors C3 and C4 be included in one semiconductor IC.

The circuit elements constituting the radio-frequency circuit 61 may be disposed in the same arrangement as FIG. 4, 5, 6, or any of 7A to 7C.

[8. Effects]

As described above, the hybrid filter 10 according to the first to fifth examples includes the module substrate 80 having the major surfaces 80a and 80b that are opposite to each other, the acoustic wave resonator elements P1 and P2 disposed at the module substrate 80, the inductors L1 to L3 disposed at the module substrate 80, and the capacitor C3 disposed at the module substrate 80. The pass band of the hybrid filter 10 is wider than the resonance band width of the acoustic wave resonator elements P1 and P2. Any of the acoustic wave resonator elements P1 and P2, the inductors L1 to L3, and the capacitor C3 is the first circuit element, and the first circuit element is disposed at the major surface 80a. Any of the acoustic wave resonator elements P1 and P2, the inductors L1 to L3, and the capacitor C3 is the second circuit element, and the second circuit element is disposed at the major surface 80b.

In this arrangement, the first circuit element and the second circuit element, which constitute the hybrid filter 10, are disposed across the module substrate 80, separately on both sides of the module substrate 80. This arrangement reduces the size of the hybrid filter 10. Furthermore, unnecessary coupling between the first circuit element and the second circuit element is hindered. As a result, it is possible to provide the hybrid filter 10 of a smaller size in which degradation of the bandpass characteristic is suppressed.

In the hybrid filter 10 according to the first, second, fourth, and fifth examples, the first circuit element may be the acoustic wave resonator elements P1 and P2, and the second circuit element may be the inductors L1 to L3 or the capacitor C3.

In the hybrid filter 10 according to the first, second, fourth, and fifth examples, the second circuit element may be one of the inductors L1 to L3 and the capacitor C3, and the first circuit element may be the other of the inductors L1 to L3 and the capacitor C3.

In the hybrid filter 10 according to the first, fourth, and fifth examples, the second circuit element may be the capacitor C3.

In the hybrid filter 10 according to the third and fifth examples, the first circuit element may be the acoustic wave resonator element P1, and the second circuit element may be the acoustic wave resonator element P2.

In the hybrid filter 10 according to the fourth and fifth examples, the inductors L1 to L3 or the capacitor C3 may be formed inside the module substrate 80.

This arrangement further reduces the size of the hybrid filter 10.

In the first to fifth examples, the pass band of the hybrid filter 10 may include at least one selected from 4G-LTE Band 42, Band 43, Band 48, Band 49, 5G-NR n77, n78, n79, n46, n96, n97, and WLAN.

As a result, the hybrid filter 10 having wide-band and steep filter characteristics is usable for the above communication bands that are wide ranges close to adjacent bands.

The multiplexer 90 according to the first to fifth examples includes the hybrid filters 10 and 11.

In the multiplexer 90 according to the first to fifth examples, the pass band of the hybrid filter 10 may include 5G-NR n79, and the pass band of the hybrid filter 11 may include at least one selected from 4G-LTE Band 42, Band 43, Band 48, Band 49, 5G-NR n77, and n78.

The radio-frequency module according to the first to fifth examples includes the hybrid filter 10, the low-noise amplifier 20, the power amplifier 30, and the switch 50 for selectively connecting the hybrid filter 10 to the low-noise amplifier 20 or the power amplifier 30.

The radio-frequency module according to the first to fifth examples may include the external connection terminals 150 disposed at the major surface 80b.

In the radio-frequency module 1A according to the first example, the switch 50 may be disposed at the major surface 80b, and the capacitor C3 disposed at the major surface 80b and the switch 50 may be included in the one semiconductor IC 71.

As a result, the radio-frequency module 1A has a small-size low-profile structure.

In the radio-frequency module 1B according to the second example, the inductor L3 disposed at the major surface 80b may be an integrated passive device.

As a result, the radio-frequency module 1B has a small-size low-profile structure.

In the radio-frequency module according to the first to fifth examples, the low-noise amplifier 20 may be disposed at the major surface 80b; the radio-frequency module according to the first to fifth examples may further include the inductor of the matching circuit 45 coupled to the input terminal of the low-noise amplifier 20, disposed at the major surface 80a.

In the radio-frequency module according to the second and third modifications, it may be possible that the winding axes of the coils forming the inductors L1 to L3 are not parallel with the winding axis of the coil forming the inductor of the matching circuit 45.

This arrangement reduces the likelihood of magnetic field coupling between the inductors L1 to L3 and the inductor of the matching circuit 45. As a result, degradation of the receive sensitivity of the radio-frequency module is suppressed.

In the radio-frequency module according to the first to third modifications, it may be possible that the winding axes of the coils forming the inductors L1 to L3 and the winding axis of the coil forming the inductor of the matching circuit 45 are noncollinear.

With this arrangement, as compared to the case in which the winding axes of the inductors L1 to L3 and the winding axis of the inductor of the matching circuit 45 are collinear, the likelihood of magnetic field coupling between the inductors L1 to L3 and the inductor of the matching circuit 45 is reduced. As a result, degradation of the receive sensitivity of the radio-frequency module is suppressed.

In the radio-frequency module according to the first modification, a circuit component may be disposed between the inductors L1 to L3 and the inductor of the matching circuit 45.

With this arrangement, the circuit component hinders coupling between the magnetic flux generated around the inductors L1 to L3 and the magnetic flux generated around the inductor of the matching circuit 45. As such, it is possible to reduce the likelihood of magnetic field coupling between the inductors L1 to L3 and the inductor of the matching circuit 45. As a result, degradation of the receive sensitivity of the radio-frequency module is suppressed.

The radio-frequency module according to the first to fifth examples may further include the filter 15 coupled between the low-noise amplifier 20 and the hybrid filter 10.

In the radio-frequency module according to the first to fifth examples, the power amplifier 30 may be disposed at the major surface 80a.

In this arrangement, amplifiers for transmission and amplifiers for reception are disposed across the module substrate 80, and thus, the isolation between the transmit and receive sides in the radio-frequency module is improved.

The communication device 5 includes the RFIC 3 for processing a radio-frequency signal received by the antenna 2 and the radio-frequency module 1 for transferring the radio-frequency signal between the antenna 2 and the RFIC 3.

As a result, it is possible to provide a communication device including a hybrid filter of a smaller size in which degradation of filter characteristics is suppressed.

Other Embodiments

The hybrid filter, multiplexer, radio-frequency module, and communication device according to the present disclosure has been described by using the embodiment, examples, and modifications, but the present disclosure is not limited to the embodiment, examples, and modifications described above. The present disclosure also embraces other embodiments implemented as any combination of the constituent elements of the embodiment, examples, and modifications, other modified examples obtained by making various modifications to the embodiment that occur to those skilled in the art without departing from the scope of the present disclosure, and various hardware devices including the hybrid filter, multiplexer, radio-frequency module, or communication device according to the present disclosure.

For example, in the hybrid filter, multiplexer, radio-frequency module, and communication device according to the embodiment, examples, and modifications, a matching element such as an inductor or capacitor and a switching circuit may be coupled among the constituent elements. The inductor may include a wire inductor formed by a wire serving as an interconnection between constituent elements.

INDUSTRIAL APPLICABILITY

The present disclosure can be used, as a hybrid filter, a multiplexer, a radio-frequency module and a communication device operable in multiband systems, in a wide variety of communication devices such as mobile phones.

REFERENCE SIGNS LIST 1, 1A, 1B, 1C, 1D, 1E radio-frequency module
2, 2A, 2B antenna
3 RF signal processing circuit (RFIC)
4 baseband signal processing circuit (BBIC)
5, 5E communication device
10, 11, 12, 13 hybrid filter
15, 16, 17, 18 filter
20, 21, 22, 23 low-noise amplifier
30, 31 power amplifier
43, 44, 45, 46, 47, 48 matching circuit
50, 51, 60 switch
60a, 60b common terminal
60c, 60d, 60e, 60f selection terminal
61, 62 radio-frequency circuit
71, 72 semiconductor IC
80 module substrate
80a, 80b major surface
81, 82 resin member
85 metal shield layer
90, 91 multiplexer
100, 200, 210 antenna connection terminal
101, 102, 103, 104, 105, 106 input-output terminal
120, 121, 122, 123 receive output terminal
130, 131 transmit input terminal
150 external connection terminal
A1, A2 acoustic wave resonator
C3, C4, C6, C7, C8, C9 capacitor
L1, L2, L3, L4, L5, L6, L7, L8 inductor
P1, P2, P5, P6 acoustic wave resonator element

The invention claimed is:

1. A hybrid filter comprising:
a substrate having a first major surface and a second major surface that are opposite to each other;
one or more acoustic wave resonator elements disposed at the substrate;
one or more first inductors disposed at the substrate; and
one or more first capacitors disposed at the substrate, wherein
a pass band width of the hybrid filter is wider than a resonance band width of the one or more acoustic wave resonator elements,
one of the one or more acoustic wave resonator elements, the one or more first inductors, and the one or more first capacitors is a first circuit element, and the first circuit element is disposed at the first major surface, and
another of the one or more acoustic wave resonator elements, the one or more first inductors, and the one or more first capacitors is a second circuit element, and the second circuit element is disposed at the second major surface, wherein
one of the one or more first inductors and the one or more first capacitors is formed inside the substrate.

2. The hybrid filter according to claim 1, wherein
the first circuit element is one of the one or more acoustic wave resonator elements, and
the second circuit element is one of the one or more first inductors and the one or more first capacitors.

3. The hybrid filter according to claim 1, wherein
the second circuit element is one selected from one of the one or more first inductors and one of the one or more first capacitors, and
the first circuit element is another one selected from one of the one or more first inductors and one of the one or more first capacitors.

4. The hybrid filter according to claim 2, wherein
the second circuit element is one of the one or more first capacitors.

5. The hybrid filter according to claim 1, wherein
the first circuit element is one of the one or more acoustic wave resonator elements, and
the second circuit element is another of the one or more acoustic wave resonator elements.

6. The hybrid filter according to claim 1, wherein
a pass band of the hybrid filter includes at least one selected from Fourth Generation Long-Term Evolution (4G-LTE) Band 42, Band 43, Band 48, Band 49, Fifth Generation New Radio (5G-NR) n77, n78, n79, n46, n96, n97, Wireless Local Area Network (WLAN) (5150-5350 MHz), WLAN (5470-5850 MHz), and WLAN (5925-7125 MHz).

7. A multiplexer comprising:
a common terminal;
a first hybrid filter that is the hybrid filter according to claim 1, the first hybrid filter being coupled to the common terminal; and
a second hybrid filter that is the hybrid filter according to claim 1, the second hybrid filter being coupled to the common terminal.

8. The multiplexer according to claim 7, wherein
a pass band of the first hybrid filter includes 5G-NR n79, and
a pass band of the second hybrid filter includes at least one selected from 4G-LTE Band 42, Band 43, Band 48, Band 49, 5G-NR n77, and n78.

9. A radio-frequency module comprising:
a hybrid filter including
  a substrate having a first major surface and a second major surface that are opposite to each other,
  one or more acoustic wave resonator elements disposed at the substrate,
  one or more first inductors disposed at the substrate, and
  one or more first capacitors disposed at the substrate, wherein
  a pass band width of the hybrid filter is wider than a resonance band width of the one or more acoustic wave resonator elements,
  one of the one or more acoustic wave resonator elements, the one or more first inductors, and the one or more first capacitors is a first circuit element, and the first circuit element is disposed at the first major surface, and
  another of the one or more acoustic wave resonator elements, the one or more first inductors, and the one or more first capacitors is a second circuit element, and the second circuit element is disposed at the second major surface, wherein
    one of the one or more first inductors and the one or more first capacitors is formed inside the substrate;
a low-noise amplifier;
a power amplifier; and
a switch configured to selectively connect the hybrid filter to the low-noise amplifier or the power amplifier.

10. The radio-frequency module according to claim 9, further comprising:
a plurality of external connection terminals disposed at the second major surface.

11. The radio-frequency module according to claim 10, wherein
the switch is disposed at the second major surface, and
the second circuit element disposed at the second major surface and the switch are included in one semiconductor integrated circuit (IC).

12. The radio-frequency module according to claim 10, wherein
the second circuit element is an integrated passive device.

13. The radio-frequency module according to claim 10, wherein
the low-noise amplifier is disposed at the second major surface,
the radio-frequency module further comprising:
a second inductor coupled to an input terminal of the low-noise amplifier, the second inductor being disposed at the first major surface.

14. The radio-frequency module according to claim 13, wherein
a winding axis of a coil forming one of the one or more first inductors and a winding axis of a coil forming the second inductor are not parallel with each other.

15. The radio-frequency module according to claim 13, wherein
a winding axis of a coil forming one of the one or more first inductors and a winding axis of a coil forming the second inductor are noncollinear.

16. The radio-frequency module according to claim 13, wherein
a circuit component is disposed between one of the one or more first inductors, and the second inductor.

17. The radio-frequency module according to claim 13, further comprising:
an LC filter coupled between the low-noise amplifier and the hybrid filter.

18. The radio-frequency module according to claim 13, wherein
the power amplifier is disposed at the first major surface.

19. A communication device comprising:
a radio-frequency (RF) signal processing circuit configured to process a radio-frequency signal received by an antenna; and
the radio-frequency module according to claim 10, the radio-frequency module being configured to transfer the radio-frequency signal between the antenna and the RF signal processing circuit.

* * * * *